US012693936B2

(12) United States Patent
Chen

(10) Patent No.: US 12,693,936 B2
(45) Date of Patent: Jul. 28, 2026

(54) DATA PROCESSING METHOD AND APPARATUS TO INCREASE A BACKUP DATA AMOUNT

(71) Applicant: Huawei Technologies Co., Ltd., Shenzhen (CN)

(72) Inventor: Keyun Chen, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/405,231

(22) Filed: Jan. 5, 2024

(65) Prior Publication Data

US 2024/0143449 A1 May 2, 2024

Related U.S. Application Data

(63) Continuation of application No. PCT/CN2022/091692, filed on May 9, 2022.

(30) Foreign Application Priority Data

Jul. 8, 2021 (CN) .......................... 202110773758.9
Sep. 9, 2021 (CN) .......................... 202111057198.3

(51) Int. Cl.
*G06F 11/1446* (2026.01)
*G06F 16/174* (2019.01)
*H03M 7/30* (2006.01)

(52) U.S. Cl.
CPC ...... *G06F 11/1453* (2013.01); *G06F 16/1748* (2019.01); *H03M 7/30* (2013.01)

(58) Field of Classification Search
CPC .. G06F 11/1453; G06F 16/1748; G06F 3/065; G06F 3/0608; G06F 3/0641; G06F 3/067; G06F 16/174; H03M 7/30
See application file for complete search history.

(56) References Cited

U.S. PATENT DOCUMENTS

| | | | |
|---|---|---|---|
| 8,554,918 B1 * | 10/2013 | Douglis .............. | G06F 11/1458 707/640 |
| 2008/0229127 A1 * | 9/2008 | Felter .................... | G06F 1/3296 713/320 |
| 2012/0185413 A1 * | 7/2012 | Felter ................. | G06Q 30/0645 711/E12.001 |
| 2014/0114932 A1 | 4/2014 | Mallaiah et al. | |

(Continued)

FOREIGN PATENT DOCUMENTS

| | | |
|---|---|---|
| CN | 102999605 A | 3/2013 |
| CN | 107632786 A | 1/2018 |

(Continued)

*Primary Examiner* — Yuk Ting Choi
(74) *Attorney, Agent, or Firm* — Conley Rose, P.C.

(57) ABSTRACT

A data processing method includes a computing device that obtains first data, and determines a deduplication rate of the first data and a working status of the computing device. When the working status of the computing device is a busy state, and when the deduplication rate of the first data is greater than or equal to a first preset value, deduplication on the first data is performed. When the deduplication rate of the first data is lower than the first preset value, deduplication is not performed on the first data, and the first data may be directly stored.

18 Claims, 6 Drawing Sheets

(56)                    References Cited

U.S. PATENT DOCUMENTS

| | | | | |
|---|---|---|---|---|
| 2014/0258625 A1* | 9/2014 | Zhong | G06F 3/0673 | |
| | | | 711/125 | |
| 2017/0147518 A1* | 5/2017 | Gordon | G06F 13/00 | |
| | | | 707/737 | |
| 2017/0371581 A1* | 12/2017 | Rueger | G06F 16/1748 | |
| | | | 718/104 | |
| 2019/0146846 A1* | 5/2019 | Zeng | G06F 9/5038 | |
| | | | 718/104 | |
| 2021/0286765 A1* | 9/2021 | Takata | G06F 16/1865 | |
| | | | 718/104 | |
| 2022/0237158 A1* | 7/2022 | Chen | H03M 7/607 | |
| | | | 718/104 | |
| 2022/0342766 A1* | 10/2022 | Brun-Cottan | G06F 11/1458 | |
| | | | 718/104 | |

FOREIGN PATENT DOCUMENTS

| | | | | | |
|---|---|---|---|---|---|
| CN | 110727404 | A | 1/2020 | | |
| JP | 7075077 | B2 * | 5/2022 | ......... | G11B 7/08582 |
| KR | 20170073860 | A | 6/2017 | | |
| WO | 2021012162 | A1 | 1/2021 | | |

* cited by examiner

Client 10 ── Storage device 20

Application server 100

Application server 100

Switch 110

Switch 110

Storage system 120

Engine 121

Controller 0

Front-end interface 125

CPU 123 ── Memory 124

Back-end interface 126

Controller 1

Front-end interface 125

CPU 123 ── Memory 124

Back-end interface 126

Hard disk 134

Hard disk 134

Hard disk 134

...

Hard disk 134

DATA PROCESSING METHOD AND APPARATUS TO INCREASE A BACKUP DATA AMOUNT

CROSS-REFERENCE TO RELATED APPLICATIONS

This is a continuation of International Patent Application No. PCT/CN2022/091692 filed on May 9, 2022, which claims priority to Chinese Patent Application No. 202110773758.9 filed on Jul. 8, 2021 and Chinese Patent Application No. 202111057198.3 filed on Sep. 9, 2021. All of the aforementioned patent applications are hereby incorporated by reference in their entirety.

TECHNICAL FIELD

This disclosure relates to the field of computer technologies, and in particular, to a data processing method and apparatus.

BACKGROUND

In the field of information data management, backup usually means a process of copying all or a part of data sets in a file system or database system from a disk or storage array of an application host to another storage medium in a data center.

In a backup process, common data processing methods include data deduplication and data compression (or deduplication and compression). Deduplication and compression are high-consumption computing operations, and occupy computing resources of the application host. To avoid affecting a normal production service of the application host, backup is usually performed during off-peak hours, for example, from 00:00 to 08:00.

The foregoing manner is limited by limited computing resources of the application host, and cannot fully utilize time resources for backup. Consequently, a backup data amount is low.

SUMMARY

This disclosure provides a data processing method and apparatus, to increase a backup data amount and reduce storage space occupied by data.

According to a first aspect, an embodiment of this disclosure provides a data processing method. The method may be performed by a computing device (for example, a server). In the method, the computing device may first obtain data to be backed up (for example, referred to as first data), for example, may obtain the first data from a memory or a hard disk of the computing device, or may obtain the first data from another computing device. Then, the computing device determines a deduplication rate of the first data and a current working status of the computing device. The working status herein may include a busy state and an idle state, and the working status may be determined based on a usage status of a computing resource in the computing device. When the working status of the computing device is the busy state, whether the deduplication rate of the first data exceeds a threshold (for example, referred to as a first preset value) is then judged. When the deduplication rate of the first data exceeds the first preset value, data deduplication on the first data is performed to obtain second data, or when the deduplication rate of the first data does not exceed the first preset value, the first data may be stored in a first memory of the computing device.

According to the foregoing method, when computing resource utilization of the computing device is lower than the first preset value and the data deduplication rate is lower than a second preset value, deduplication is not performed on the data, to reduce computing resource overheads and ensure a backup bandwidth. Alternatively, when the computing resource utilization is lower than the first preset value, but the data deduplication rate is not lower than the second preset value, deduplication is performed on the data, to ensure the deduplication rate, reduce the storage space occupied by the backup data, and reduce storage costs. In addition, on a basis of ensuring that a normal production service is not affected, data backup may also be performed in a time period when the computing resource utilization is low, for example, lower than the second preset value. In this way, backup can be performed in as much time as possible, to increase the backup data amount.

In a possible implementation, after obtaining the second data, the computing device may further determine a compression rate of the second data. If the compression rate of the second data is greater than or equal to a second preset value, and computing resource utilization is lower than a third preset value, compression is performed on the second data, or if the compression rate of the second data is greater than or equal to the second preset value, and the computing resource utilization is greater than or equal to the third preset value, compression is performed on a part of the second data.

According to the foregoing method, after deduplication is performed on the data, compression may be performed based on the compression rate of the deduplicated second data. If the compression rate is high but the computing resource utilization is high, for example, not lower than the third preset value, compression may not be performed on the second data, to reduce computing resource consumption and ensure the backup bandwidth. If the computing resource utilization is low, for example, lower than the third preset value, compression is performed on the second data, to ensure the compression rate, reduce the storage space occupied by the backup data, and increase a logical backup bandwidth.

In a possible implementation, the computing device further includes a second memory, and performance of the second memory is lower than that of the first memory. If the compression rate of the second data is lower than the second preset value, the second data is stored in the second memory, or if the compression rate of the second data is greater than or equal to the second preset value, compression is performed on the at least a part of the second data. Compressed data is stored in the second memory, and uncompressed data of the second data is stored the first memory.

According to the foregoing method, because the compression rate of the second data is low, compression may not be performed on the second data, and the second data can be directly stored, to reduce the computing resource overheads and ensure the backup bandwidth. When the compression rate of the second data is high, compression may be performed on the at least a part of the second data, to ensure the compression rate, reduce the storage space occupied by the backup data, and increase the logical backup bandwidth. In addition, in a tiered storage manner, data to be compressed is stored in the first memory with higher performance, and data that does not need to be compressed or that is compressed is stored in the second memory. During background compression, the data to be compressed may be obtained from the first memory at a high speed, to improve data reading performance.

In a possible implementation, the computing device may determine the deduplication rate of the first data in the following manners. For example, the computing device may determine the deduplication rate of the first data based on an attribute parameter of the first data, based on a deduplication rate of target data corresponding to the first data, where the target data is data selected based on a preset condition, or based on a similarity between the first data and data stored in the computer device.

According to the foregoing method, flexibility of determining the data deduplication rate is improved.

In a possible implementation, when the computing device is in the idle state, data deduplication and/or data compression may be performed on the first data, where the idle state is determined based on the usage status of the computing resource of the computing device.

In a possible implementation, the computing resource includes a processor resource and/or a memory. For example, when processor utilization exceeds a fourth preset value, and/or memory utilization exceeds a fifth preset value, it may indicate that the working status of the computing device is the busy state, or when the processor utilization does not exceed the fourth preset value, and/or the memory utilization does not exceed the fifth preset value, it may indicate that the working status of the computing device is the idle state.

In a possible implementation, when a first preset condition is met, the computing device may obtain uncompressed data from the first memory, and perform compression on the uncompressed data, and compressed data may be stored in the second memory. The first preset condition includes that the computing device is in the idle state, or preset time is reached, or a data amount of the first memory reaches a sixth preset value.

According to the foregoing method, the background compression is performed when the first preset condition is met, so that impact on a normal production service can be avoided. In addition, through the background compression, the data compression rate can be further ensured, and the storage space occupied by the backup data can be reduced.

In a possible implementation, when a second preset condition is met, the computing device may obtain un-deduplicated first data from the first memory, and perform deduplication and compression on the first data to obtain third data. Optionally, the third data may be stored in the second memory, where performance of the second memory is lower than that of the first memory. The second preset condition includes that the computing device is in the idle state, or the preset time is reached, or the data amount of the first memory reaches the sixth preset value.

According to the foregoing method, the background deduplication and compression are performed when the second preset condition is met, so that impact on the normal production service can be avoided. In addition, through the background deduplication and compression, the data deduplication rate and the data compression rate can be further ensured, and the storage space occupied by the backup data can be reduced.

According to a second aspect, an embodiment of this disclosure further provides a data processing apparatus. The data processing apparatus has functions of implementing the behavior in the method instance of the first aspect. For beneficial effects, refer to the descriptions of the first aspect. Details are not described herein again. The functions may be implemented by using hardware, or may be implemented by executing corresponding software by hardware. The hardware or software includes one or more modules corresponding to the foregoing functions. In a possible design, a structure of the data processing apparatus includes an obtaining module, a determining module, a judging module, and a processing module. These modules may perform corresponding functions in the method example in the first aspect. For details, refer to detailed descriptions in the method example. Details are not described herein again.

According to a third aspect, this disclosure further provides a computing device. The computing device includes a processor and a memory, and may further include a communication interface. The processor executes program instructions in the memory to perform the method according to any one of the first aspect or the possible implementations of the first aspect. The computing device may be a device such as a computing node, a server, or a controller in a storage system, or may be a computing device that needs to exchange data. The memory is coupled to the processor, and stores program instructions and data that are necessary for determining a data processing process. The communication interface is configured to communicate with another device, for example, obtain first data.

According to a fourth aspect, this disclosure provides a computing device system, and the computing device system includes at least one computing device. Each computing device includes a memory and a processor. The processor of at least one computing device is configured to access code in the memory to perform the method according to any one of the first aspect or the possible implementations of the first aspect.

According to a fifth aspect, this disclosure provides a computer-readable storage medium. When the computer-readable storage medium is executed by a computing device, the computing device performs the method according to any one of the first aspect or the possible implementations of the first aspect. The storage medium stores a program. The storage medium includes but is not limited to a volatile memory, for example, a random-access memory (RAM), and a non-volatile memory, for example, a flash memory, a hard disk (HDD), or a solid-state drive (SSD).

According to a sixth aspect, this disclosure provides a computing device program product, where the computing device program product includes computer instructions. When the computer instructions are executed by a computing device, the computing device performs the method according to any one of the first aspect or the possible implementations of the first aspect. The computer program product may be a software installation package. When the method according to any one of the first aspect or the possible implementations of the first aspect needs to be used, the computer program product may be downloaded and executed on the computing device.

According to a seventh aspect, this disclosure further provides a computer chip, where the chip is connected to a memory, and the chip is configured to read and execute a software program stored in the memory, to perform the method according to the first aspect and the possible implementations of the first aspect.

DESCRIPTION OF EMBODIMENTS

Figures 1, 2:
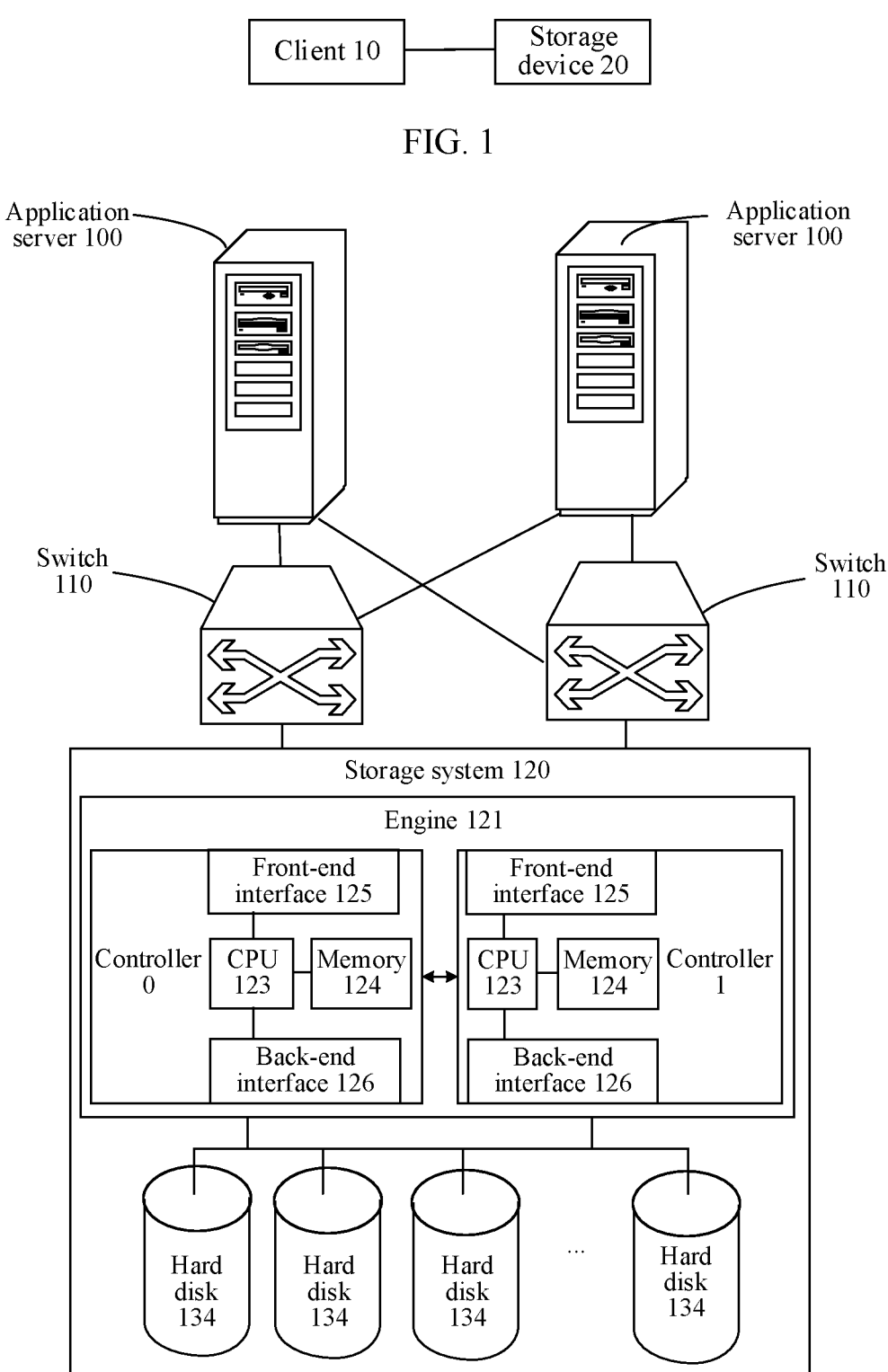
FIG. 1 is a schematic diagram of a backup system according to an embodiment of this disclosure.
FIG. 2 is a schematic diagram of a system architecture according to an embodiment of this disclosure.

A data processing method provided in an embodiment of this disclosure may be applied to a backup system shown in FIG. 1. Refer to FIG. 1. The system includes a client 10 and a storage device 20.

The client 10 is configured to provide data to be backed up, and may be a computing device deployed on a user side, or may be software on the computing device. The computing device may be a physical machine or a virtual machine. Physical machines include but are not limited to a desktop computer, a server (such as an application server, a file server, and a database server), a laptop, and a mobile device. The software may be an application program installed on the computing device, for example, backup software. A main function of the backup software is to manage a backup policy, for example, when to start backup, what content on the client 10 is backed up, and where to back up data. The client 10 may communicate with the storage device 20 through a network or another manner. The network typically represents any telecommunication or computer network, including, for example, an enterprise intranet, a wide area network (WAN), a local area network (LAN), a personal area network (PAN), or the Internet.

The storage device 20 is configured to provide services such as storage resources and computing resources for the client 10. In this disclosure, the storage device 20 may be used as a backup medium to store data of the client 10.

It should be noted that only one client 10 and one storage device 20 are shown in FIG. 1 for brevity. In actual application, a quantity of clients 10 and a quantity of storage devices 20 are not limited in this embodiment of this disclosure. For example, the storage device 20 in this disclosure may be a centralized storage system. For another example, the storage device 20 may be any storage device in a distributed storage system.

Two specific system architectures are listed as follows.

FIG. 2 is a schematic diagram of a system architecture according to an embodiment of this disclosure. Refer to FIG. 2. The system architecture includes an application server 100, a switch 110, and a storage system 120. The client 10 in FIG. 1 may be the application server 100 in FIG. 2, and the storage device 20 in FIG. 1 may be the storage system 120 in FIG. 2.

A user accesses data through an application program. A computer that runs these application programs is referred to as an "application server". The application server accesses the storage system 120 by using the optical fiber switch 110 to access the data. However, the switch 110 is only an optional device, and the application server 100 may alternatively directly communicate with the storage system 120 through the network. For the network, refer to the foregoing descriptions, and details are not described herein again.

The storage system 120 shown in FIG. 2 is a centralized storage system. The centralized storage system has a feature of having a unified entry. All data from an external device needs to pass through this entry. This entry is an engine 121 of the centralized storage system. The engine 121 is a core component in the centralized storage system, and many advanced functions of the storage system are implemented in the engine 121.

As shown in FIG. 2, there are one or more controllers in the engine 121. In FIG. 2, an example in which the engine includes two controllers is used for description. A mirror channel exists between a controller 0 and a controller 1, so that the two controllers can be mutually backed up. The engine 121 further includes a front-end interface 125 and a back-end interface 126. The front-end interface 125 is configured to communicate with the application server 100, to provide a storage service for the application server 100. The back-end interface 126 is configured to communicate with a hard disk 134, to expand a capacity of the storage system. Through the back-end interface 126, the engine 121 is connected to more hard disks 134, to form a very large storage resource pool.

In terms of hardware, as shown in FIG. 2, the controller 0 includes at least a processor 123 and a memory 124. The processor 123 is implemented by a central processing unit (CPU), a hardware logic circuit, a processing core, an application-specific integrated circuit (ASIC), an artificial intelligence (AI) chip, or a programmable logic device (PLD). The PLD may be a complex PLD (CPLD), a field-programmable gate array (FPGA), a generic array logic (GAL), a system on chip (SoC), or any combination thereof.

The processor 123 is configured to process a data access request from outside the storage system 120 (a server or another storage system), and is also configured to process a request generated inside the storage system 120. For example, when the processor 123 receives, through the front-end interface 125, a data writing request sent by the application server 100, the processor 123 may preferentially store the data in a memory, for example, the memory 124. When a data amount in the memory 124 reaches a specific threshold, the processor 123 sends, through the back-end interface 126, the data stored in the memory 124 to the hard disk 134 for persistent storage. The processor 123 is further configured to perform calculation or processing on the data, for example, data deduplication, data compression, data check, storage space virtualization, and address translation. FIG. 1 shows only one processor 123. In actual application, there are usually a plurality of processors 123, and one processor 123 has one or more processor cores. A quantity of processors and a quantity of processor cores are not limited in this embodiment.

The memory 124 is an internal memory that directly exchanges data with the processor 123. The memory 124 can read and write data at any time at a high speed, and is used as a temporary data memory of an operating system or another running program. The memory 124 includes at least two types of memories. For example, the memory 124 may be a RAM, or a read-only memory (ROM). For example, the RAM is a dynamic RAM (DRAM), or a storage class memory (SCM). The DRAM is a semiconductor memory, and, like most RAMs, is a volatile memory device. The SCM is a composite storage technology that combines characteristics of a traditional storage apparatus and the memory. The SCM can provide higher read and write speed than a hard disk, but access speed is slower than that of the DRAM, and costs are lower than the DRAM. However, the DRAM and the SCM are merely examples for description in this embodiment of this disclosure. The memory may further include another RAM, for example, a static RAM (SRAM). The ROM may be, for example, a programmable ROM (PROM), or an erasable PROM (EPROM). In addition, the memory 124 may alternatively be a dual in-line memory module or a dual in-line memory module (DIMM), that is, a module consisting of the DRAM. In an actual application, a plurality of memories 124 and different types of memories 124 may be configured in the storage system 120. A quantity and a type of the memory 124 are not limited in this embodiment.

A hardware component and a software structure of the controller 1 (and another controller not shown in FIG. 2) are similar to those of the controller 0, and details are not described herein again.

FIG. 2 shows a centralized storage system in which a disk and the controller are separated. In the system, the engine 121 may not have a hard disk slot, the hard disk 134 needs to be placed in a hard disk enclosure 130, and the back-end interface 126 communicates with the hard disk enclosure 130. The back-end interface 126 exists in the engine 121 in a form of an adapter card. One engine 121 may simultaneously use two or more back-end interfaces 126 to connect to a plurality of disk enclosures. Alternatively, the adapter card may be integrated on a main board. In this case, the adapter card may communicate with the processor 123 through a high-speed serial computer extended (Peripheral Component Interconnect Express (PCIe) bus. Optionally, the storage system 120 may alternatively be a storage system in which the disk and the controller are integrated. The engine 121 has the hard disk slot, and the hard disk 134 may be directly deployed in the engine 121. In other words, the hard disk 134 and the engine 121 are deployed in a same device.

The hard disk 134 is usually configured to persistently store data. The hard disk 134 may be a non-volatile memory, for example, a ROM, an HDD, an SCM, or an SSD. Both performance of the SSD and performance of the SCM are higher than that of the HDD. Performance of the memory in this disclosure is mainly considered from aspects such as operation speed and/or an access delay. In a possible architecture, the storage device 20 includes at least two types of hard disks (for example, denoted as a first memory and a second memory) with different performance. For example, the first memory and the second memory are respectively the SSD and the HDD, the SSD and the SCM, or the SCM and the HDD. For ease of description, the following uses an example in which the first memory is the SSD and the second memory is the HDD.

It should be noted that a hardware architecture of the application server 100 is not shown in FIG. 2. In terms of hardware, the application server 100 may include a processor, a memory, and a network interface card, and optionally, may further include a hard disk. For types and functions of the components included in the application server 100, refer to related descriptions of the storage system 120. Details are not described herein again.

Figure 3:
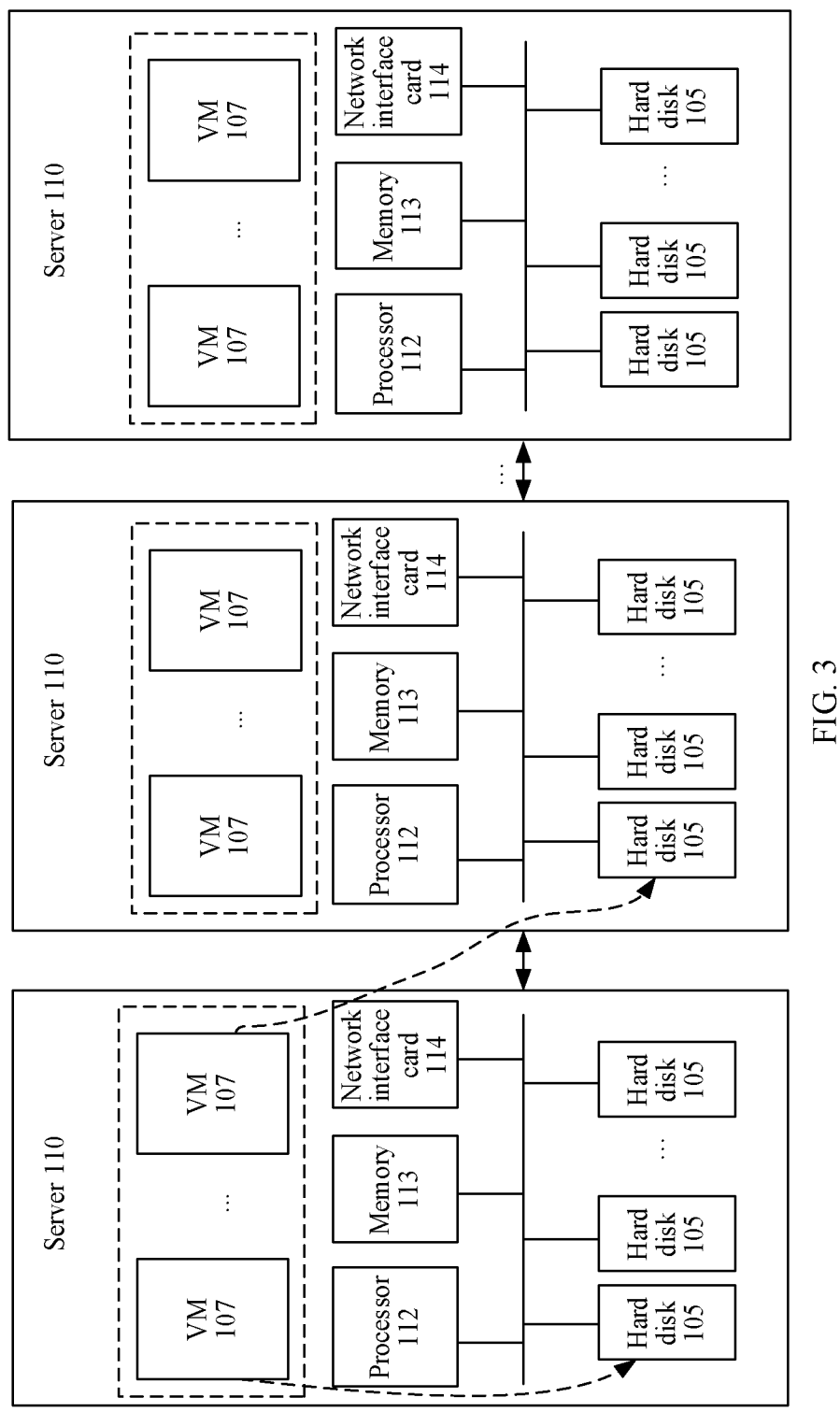
FIG. 3 is a schematic diagram of another system architecture according to an embodiment of this disclosure.

In addition to the centralized storage system, the data processing method provided in this embodiment of this disclosure is also applicable to the distributed storage system. FIG. 3 is a schematic diagram of a system architecture of a distributed storage system according to an embodiment of this disclosure. The distributed storage system includes a server cluster. Refer to FIG. 3. The server cluster includes one or more servers 110 (where three servers 110 are shown in FIG. 3, but it is not limited to the three servers). The servers 110 may communicate with each other. Optionally, a virtual machine 107 may also be created on the server 110. Required computing resources are from a local processor 112 and a local memory 113 of the server 110. Various application programs may be run on the virtual machine 107. The client 10 may be the virtual machine 107, or may be a computing device (not shown in FIG. 3) other than the server 110, or the like.

In terms of hardware, as shown in FIG. 3, the server 110 includes at least a processor 112, a memory 113, a network interface card 114, and a hard disk 105. The processor 112, the memory 113, the network interface card 114, and the hard disk 105 are connected through a bus. The bus includes but is not limited to a PCIe bus, a double data rate (DDR) bus, an interconnection bus supporting multi-protocol (a multi-protocol interconnection bus for short below, which is described in detail in the following), a Serial advanced technology Attachment (SATA) bus, a Serial Attached Small Computer System Interface (SCSI) (SAS) bus, a Controller Area Network (CAN) bus, a computer express link (CXL) standard bus, and the like. For functions and specific types of the processor 112, the memory 113, the network interface card 114, and the hard disk 105, refer to related descriptions in FIG. 2. Details are not described herein again.

The foregoing centralized storage system and distributed storage system are merely examples. The data processing method provided in this embodiment of this disclosure is also applicable to another centralized storage system and another distributed storage system.

The data processing method provided in this embodiment of this disclosure may be applied to a data backup scenario. When the data processing method provided in this embodiment of this disclosure is applied, the computing device determines a deduplication and compression manner based on a usage status of a computing resource and a data feature of data to be backed up. In this way, a production service of the computing device is not affected, a backup task is not limited by backup time specified in a backup policy, and as many backup tasks can be executed as possible, to increase a backup data amount. In addition, the computing resource can be used as much as possible to perform data deduplication to ensure a deduplication rate and reduce storage space occupied by the data.

In this disclosure, implementation of the data processing method may be classified into source-end implementation and target-end implementation based on an implementation location. FIG. 1 is used as an example. The source-end implementation means that the client 10 performs the data processing method provided in this embodiment of this disclosure. The target-end implementation means that the storage device 20 performs the data processing method provided in this embodiment of this disclosure.

Figure 4:
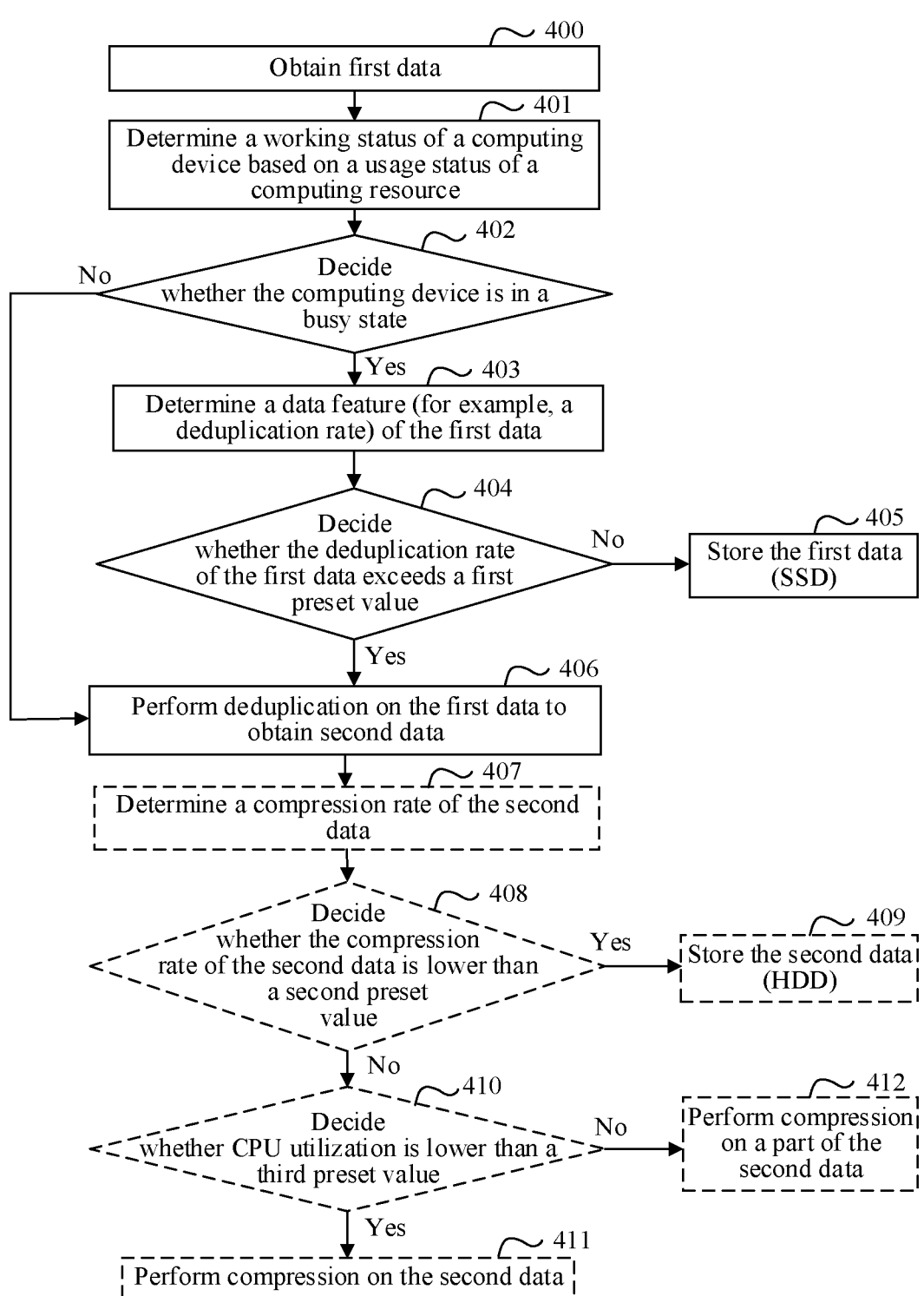
FIG. 4 is a schematic flowchart of a data processing method according to an embodiment of this disclosure.

With reference to FIG. 4, the following describes a data processing method provided in an embodiment of this disclosure by using the system mentioned in FIG. 1 as an example. Correspondingly, a computing device mentioned in the method may be the client 10 or the storage device 20 in FIG. 1. As shown in FIG. 4, the method includes the following steps.

Step 400: A processor obtains data to be backed up (for example, referred to as first data).

The processor obtains the data to be backed up in a plurality of manners. For example, on a side of the client 10, the data to be backed up may be obtained from a data writing request of an application program. Alternatively, the data carried in the data writing request triggered by the application program is first temporarily stored in a memory (for example, a memory or a hard disk) of the client 10, and then the data to be backed up is obtained from the memory. For another example, on a side of the storage device 20, in addition to the foregoing obtaining the data to be backed up locally, the storage device 20 may further obtain the data to be backed up from a data writing request received from the client 10.

Step 401: Determine a working status of the computing device based on a usage status of a computing resource.

The computing resource herein is a resource, such as a CPU and the memory, that is on the computing device and that is used to perform operations such as computing and data processing. The computing resource in this disclosure includes but is not limited to one or more of a CPU, a memory, and the like. For example, when the computing resource is the CPU, a usage status of the computing resource may be represented by a parameter such as CPU utilization or a CPU idle rate. It is clear that, this is not limited in this embodiment of this disclosure. All parameters that can reflect the usage status of the CPU are applicable to this embodiment of this disclosure. For another example, when the computing resource is the memory, the usage status of the computing resource may be represented by parameters such as memory utilization, a memory idle rate, a used memory amount, and a remaining memory amount.

The working status of the computing device may be determined based on the usage status of the computing resource. The working status of the computing device includes but is not limited to an idle state and a busy state. For ease of description, the following uses an example in which the CPU utilization represents the usage status of the computing resource. For example, if the CPU utilization is lower than a threshold (for example, a preset value A), the computing device is determined to be in the idle state. On the contrary, if the CPU utilization is greater than or equal to the preset value A, the computing device is determined to be in the busy state. The CPU utilization may be determined by invoking a related system function. Details are not described herein again. Any manner of determining the CPU utilization is applicable to this embodiment of this disclosure.

Step 402: Judge whether the computing device is in the busy state, if yes, perform step 403, otherwise, perform step 406.

It may be understood that, in step 402, it may also be determined whether the computing device is in the idle state, and if the computing device is in the idle state, step 406 is performed, otherwise, step 403 is performed.

Step 403: Determine a data feature of the first data.

The data feature of the first data includes but is not limited to a deduplication rate. The deduplication rate herein may be understood as a degree of repetition between the first data and stored data. If the first data and the stored data include 75% same data, the deduplication rate of the first data is 75%. The following describes several manners of determining the deduplication rate of the first data.

Manner 1: The deduplication rate of the first data is determined based on an attribute parameter (for example, a first attribute parameter) of the first data.

The first attribute parameter of the first data may be generated by the application program, for example, backup software or an application program that generates the first data. The processor may predict the deduplication rate of the first data based on the first attribute parameter generated by the application program for the first data.

For example, the first attribute parameter may be a backup type of the first data. A person skilled in the art may know that the backup type includes full backup, differential backup, and incremental backup. The full backup is completely copying all data at a time point, that is, all data of content to be backed up is backed up. The differential backup is based on previous full backup, and only newly generated data or changed data is backed up. It should be noted that, between two consecutive times of full backup, a plurality of times of differential backup may be performed, and the plurality times of backup are based on a same time of full backup. Therefore, most of data backed up in the plurality of times of differential backup may be the same. A basis of the incremental backup is different from that of the differential backup. In the incremental backup, the newly generated data or changed data is backed up based on previous backup. Therefore, in the incremental backup, different data is backed up each time.

It should be noted that the foregoing backup types are merely examples, and the first attribute parameter may alternatively be another parameter, for example, an identifier that indicates the deduplication rate. For example, when the backup software determines that the backup type of the first data is the full backup or the differential backup, the first attribute parameter may be set to an identifier that indicates a high deduplication rate, or when the backup type of the first data is the incremental backup, the first attribute parameter may be set to an identifier that indicates a low deduplication rate. This is not limited in this embodiment of this disclosure.

Manner 2: The deduplication rate is determined based on a deduplication rate of target data corresponding to the first data.

In this disclosure, the deduplication rate of the first data may be determined based on the deduplication rate of the target data corresponding to the first data. For example, the deduplication rate of the target data is used as the deduplication rate of the first data. The target data herein may be data other than the first data. For example, the target data corresponding to the first data may be data before the first data, for example, data carried in a previous data writing request of the first data, or the target data is a part of the first data. The deduplication rate of the target data may be an actual deduplication rate of the target data determined by performing deduplication on the target data, or may be a deduplication rate of the target data determined in another manner, for example, the deduplication rate of the target data determined in the foregoing manner 1 of determining the deduplication rate or the following manner 3 of determining the deduplication rate. This is not limited in this embodiment of this disclosure.

For example, a file is used as a granularity, and is divided into a plurality of data blocks. For example, data included in one or more data blocks is used as target data of the file. For another example, to improve precision, one or more data blocks may be periodically collected, and data included in these data blocks is referred to as target data in the periodicity. Then, the deduplication rate of the target data is determined, and the deduplication rate of the target data is used as a deduplication rate of other data in a same periodicity as the target data. For example, it is assumed that a size of a file is 1 gigabyte (GB), and the file is divided into a plurality of data blocks, for example, 256 data blocks of a size of 4 megabytes (MB). It is assumed that target data in each periodicity is the first data block in the periodicity, and an actual deduplication rate of the target data is used as an example. Deduplication is first performed on the first data block of 4 MB in the periodicity to determine an actual deduplication rate of the data block. If deduplicated data is 3 MB, the deduplication rate is 75%, and a deduplication rate of remaining data in the periodicity is also determined to be 75%. A specific deduplication manner is described in detail in the following, and details are not described herein again. Each periodicity may be an equal time interval, or each periodicity may include a same quantity of data blocks. For example, duration of each periodicity is T, or each periodicity includes N data blocks.

In the foregoing descriptions, the first data may be the file, or may be a part of data in the file. This is not limited in this embodiment of this disclosure.

Manner 3: The deduplication rate is determined based on a similarity between the first data and the stored data.

For example, the similarity between the first data and the stored data may be determined based on similar fingerprints of the first data and the stored data. The process may include the following. A similar fingerprint of the first data is first calculated, for example, the first data is divided into a plurality of blocks, and a hash operation is performed in blocks to obtain a hash value of each block. These hash values form a fingerprint of the first data. Then, the similar fingerprint of the first data is matched with a similar fingerprint of the stored data, and a maximum similarity value between the first data and the stored data is determined. The similar fingerprint of the stored data may be determined in the foregoing manner, and details are not described herein again.

It should be noted that a time sequence of step 402 and step 403 is not strictly limited in this disclosure. For example, step 402 and step 403 may be performed simultaneously, or step 403 is performed before or after step 402. This is not limited in this embodiment of this disclosure.

Step 404: Determine whether the deduplication rate of the first data exceeds a first preset value. If the deduplication rate of the first data does not exceed the first preset value, perform step 405, otherwise, perform step 406.

In the manner 1 of determining the deduplication rate, for example, the first attribute parameter is the backup type. If the backup type of the first data is the differential backup or the full backup, it may indicate that the deduplication rate of the first data is high. In the application, it may be further indicated as that the deduplication rate of the first data exceeds the first preset value. If the backup type of the first data is the incremental backup, it indicates that the deduplication rate of the first data does not exceed the first preset value.

In the manner 3 of determining the deduplication rate, if the maximum similarity value between the first data and the stored data is greater than a preset value B, it is considered that the deduplication rate of the first data exceeds the first preset value. On the contrary, if the maximum similarity value is less than or equal to the preset value B, it is considered that the deduplication rate of the first data does not exceed the first preset value.

Step 405: Store the first data without performing deduplication and compression.

Figure 5:
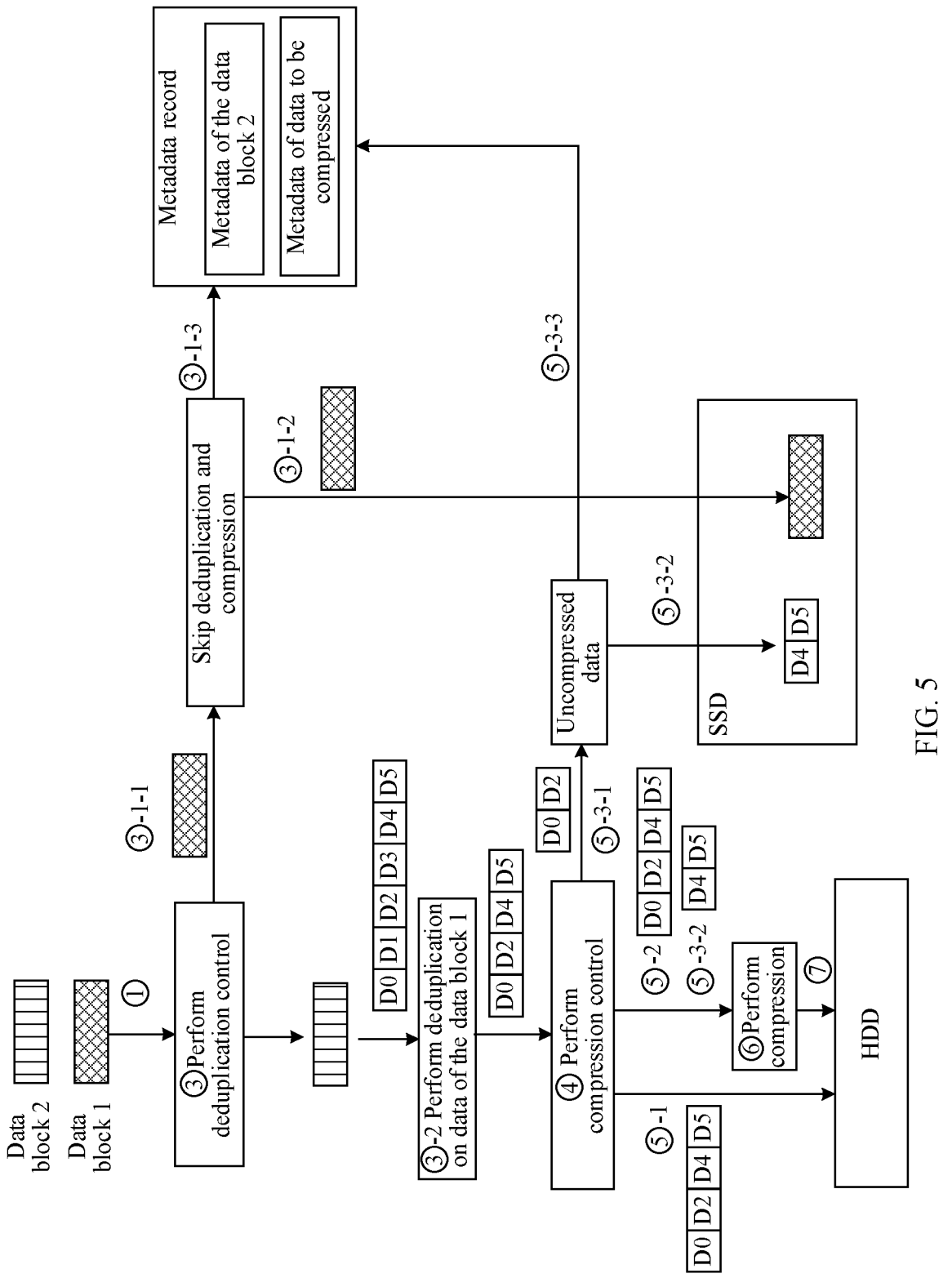
FIG. 5 is a schematic diagram of a data processing method according to an embodiment of this disclosure.

With reference to FIG. 5, it is assumed that the first data is a data block 1, and if the deduplication rate of the first data does not exceed the first preset value, deduplication and compression are not performed on the first data (refer to 3-1-1 in FIG. 5). In an optional implementation, the first data may be stored in an SSD (refer to 3-1-2 in FIG. 5), and metadata of the first data is generated (refer to 3-1-3 in FIG. 5). The metadata may be used to record information such as a storage location of the first data in the SSD, whether deduplication is performed on the first data, or whether background deduplication needs to be performed. Subsequently, the first data may be read from the SSD based on the metadata to perform background deduplication. In this design, consumption of the computing resource when the computing device is in the busy state is reduced, impact on a backup bandwidth is reduced, and the data deduplication rate is ensured by using a background deduplication mechanism to further reduce storage space occupied by data.

It should be noted that step 405 is merely an example of an optional implementation. In this disclosure, compression may further be performed on data with a deduplication rate lower than the first preset value. Descriptions are provided in the following, and details are not described herein again.

Step 406: Perform deduplication on the first data, and record deduplicated data as second data.

With reference to FIG. 5, it is assumed that the first data is a data block 2. If the deduplication rate of the first data exceeds the first preset value, deduplication is performed on the first data (refer to 3-2 in FIG. 5).

Further, based on a size of a deduplication granularity, the deduplication method includes at least file-level deduplication and sub-file-level deduplication (also referred to as block-level deduplication). The file-level deduplication is deduplication performed by using a file as a unit. (1) The file-level deduplication is also referred to as single-instance storage (SIS), and detects and removes duplicate file copies. The file-level deduplication stores only one copy of a file, so that other copies are replaced by a pointer to the unique copy. The file-level deduplication is simple and fast, but does not eliminate duplicate content in the file. For example, two PowerPoint presentation files, each of 10 MB, are different only in title pages, and are not considered as duplicate files. The two files are stored separately. (2) The sub-file-level deduplication divides a file or an object into fixed-size or variable-size data blocks and performs deduplication by using a data block as a unit. The sub-file-level deduplication removes duplicate data between files. The sub-file deduplication can be implemented in two manners: a manner of fixed-length blocks and a manner of variable-length segments. Fixed-length block deduplication divides the file into fixed-length blocks and uses a hash algorithm to find the duplicate data. The fixed-length block deduplication is simple, but may miss a lot of duplicate data because similar data may have different block boundaries. It is assumed that a name of a person is added to a title page of a document, and the entire document shifts, and all blocks change. Consequently, duplicate data cannot be detected. In the variable-length segment deduplication, if there is a change in a segment, only a boundary of the segment is adjusted and segments left remain unchanged. In comparison with the fixed block method, this method improves an ability of identifying duplicate data segments.

A data deduplication process is described by using the block-level deduplication of a variable size as an example. First, a boundary of each block in a piece of data is determined based on a preset algorithm (for example, a change data capture (CDC) algorithm), so that the data is divided into a plurality of blocks, where sizes of the blocks may be different. Then, a hash operation (for example, SHA1) is performed by using a block as a unit. An obtained hash value is similar to fingerprint information of the data block, and data blocks with same content have same fingerprint information. In this way, whether content of the data blocks is the same can be determined through fingerprint matching. Then, the fingerprint matching is performed on the data block and a data block that already exists in the storage, a previously stored data block is not stored repeatedly, and the data block is recorded by using only the hash value as index information. The index information of the data block is mapped to a specific storage location. A new data block that is not stored before is physically stored and then recorded by using a hash index. As shown in FIG. 5, deduplication is performed on data 2 (D0, D1, D2, D3, D4, and D5). It is assumed that D1 and D3 are duplicate data blocks. In this case, deduplication is performed on D1 and D3 to obtain second data (D0, D2, D4, and D5). According to the foregoing process, it can be ensured that the same data block is stored on a physical medium once, to achieve an objective of deduplication.

In an implementation, an actual deduplication rate of the first data is monitored as a basis for obtaining the data deduplication rate in step 403. Optionally, whether deduplication is performed on subsequent data may be determined based on the actual deduplication rate of the first data.

Step 407: Determine a compression rate of the second data.

The following describes two manners of determining the compression rate of the second data.

Manner 1: The compression rate is determined based on a second attribute parameter of the second data.

For example, the second attribute parameter includes but is not limited to a file type. For example, when the file type is audio and video, it indicates that a compression rate of the first data may be low. For example, when the file type is a text file or an office file, it indicates that the compression rate of the first data is high. It should be noted that the foregoing file type is merely an example, and the second attribute parameter may alternatively be another parameter. This is not limited in this embodiment of this disclosure. In addition, similar to the first attribute parameter, the second attribute parameter may be generated by the application program for the first data. Because the second data is actually data obtained by performing deduplication on the first data, the second attribute parameter of the first data is the second attribute parameter of the second data.

Manner 2: The compression rate is determined based on a compression rate of target data corresponding to the second data.

Similar to the manner 2 of determining the deduplication rate, in this disclosure, the compression rate of the second data may be determined based on the compression rate of the target data corresponding to the second data. For example, the compression rate of the target data is used as the compression rate of the second data. The target data may be a part of the second data, or the target data may be data other than the second data. For a manner of determining the target data, refer to the foregoing related descriptions. Details are not described herein again. For example, data (which belongs to a same file as the first data) carried in a previous write input/output (I/O) request of the first data (including the second data) is used as the target data. The compression rate of the target data may be an actual compression rate of the target data, or may be a predicted compression rate, for example, the compression rate of the target data determined in the manner 1 of determining the compression rate. This is not limited in this embodiment of this disclosure.

Step 408: Judge whether the compression rate of the second data is lower than a second preset value. If the compression rate of the second data is lower than the second preset value, perform step 409, otherwise, perform step 410.

Step 409: Store the second data without performing compression.

With reference to FIG. 5, if the compression rate of the second data (for example, D0, D2, D4, and D5) is low, in an optional implementation, the second data may be stored in an HDD (refer to 5-1 in FIG. 5). In this design, because compression is not performed on the second data, computing resource overheads can be reduced.

Step 410: Judge whether the CPU utilization is lower than a preset value (for example, a third preset value). If the CPU utilization is lower than the preset value, perform step 411, otherwise, perform step 412.

Step 411: Perform compression on the second data, and record compressed data as third data.

In this embodiment of this disclosure, compression (refer to 6 in FIG. 5) may be performed on the second data (refer to 5-2 in FIG. 5) by using a compression algorithm. For example, the compression algorithm may be a Shannon-Vanno algorithm, Huffman coding, arithmetic coding, or LZ77/LZ78 coding. The compression algorithm is not limited in this embodiment of this disclosure. Any existing algorithm that can perform compression on data and any compression algorithm that may be applied in the future are applicable to this embodiment of this disclosure. In addition, the compression algorithm may be specified by a user, or the compression may be system adaptive compression. This is not limited in this embodiment of this disclosure. In an implementation, the compressed data (namely, the third data) may be stored in the HDD (refer to 7 in FIG. 5, and similar parts in the following are not described herein again), to complete data backup of the first data.

In an implementation, the processor may monitor an actual compression rate of the second data as a basis for obtaining the data compression rate in step 407. Optionally, whether compression is performed on subsequent data may be determined based on the actual compression rate of the second data.

Step 412: Perform compression on a part of the second data.

As shown in 5-3-1 in FIG. 5, compression may be performed on a part of data (for example, D0 and D2) selected in the second data (for example, D0, D2, D4, and D5), and compression is not performed on other data (for example, D4 and D5). A selection manner may be random, or may meet a preset rule, for example, data at a front location is selected. This is not limited in this embodiment of this disclosure. For the compression manner, refer to the foregoing related descriptions, and details are not described herein again.

In an implementation, the uncompressed part of data may be stored in the SSD (refer to 5-3-2 in FIG. 5) first and metadata of the data may be recorded (refer to 5-3-3 in FIG. 5). The metadata may include information such as a storage location of the data in the SSD and whether compression is performed on the data. Subsequently, the processor may read the data from the SSD based on the metadata for compression. In this design, when the CPU utilization is high, overheads on the CPU are reduced, impact on the backup bandwidth is reduced, and a data reduction rate is ensured to further reduce the storage space occupied by the data and reduce storage costs.

Figure 6:
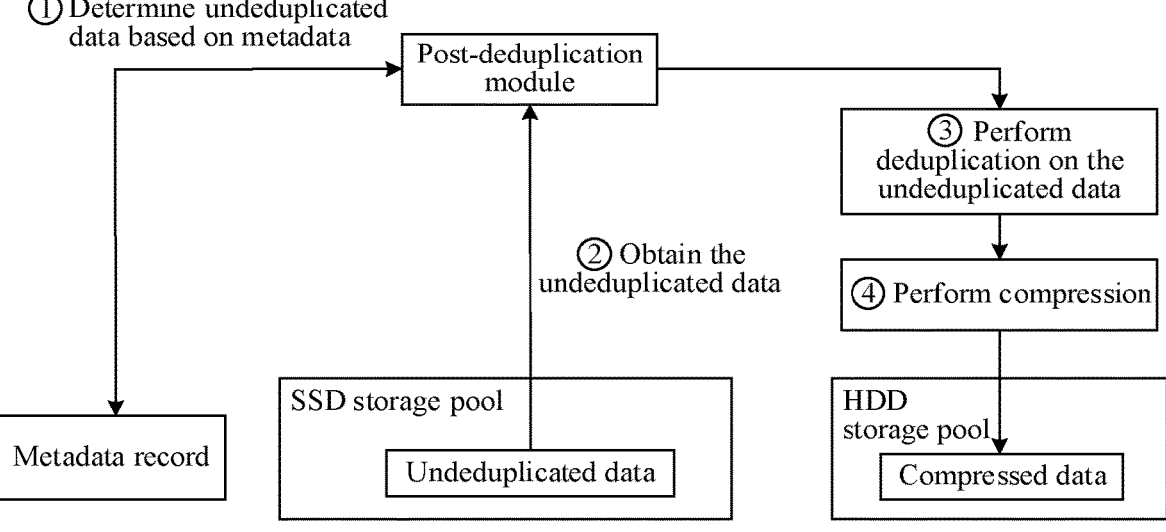
FIG. 6 is a schematic flowchart of a background deduplication manner according to an embodiment of this disclosure.

To further reduce the storage space occupied by the data, in an optional implementation, in this embodiment of this disclosure, background deduplication may be further performed on un-deduplicated data stored in the SSD. As shown in FIG. 6, the background deduplication process may include the following steps. (1) A post-deduplication module may determine the un-deduplicated data (for example, the data block 1 in FIG. 5) based on the metadata record. (2) The data is obtained from the SSD. (3) Deduplication is performed on the data. (4) Optionally, processing such as compression may be further performed on deduplicated data, and then processed data is stored in the HDD, to complete data backup of the data. The post-deduplication module may be a software module or a hardware module. This is not limited in this embodiment of this disclosure. In the foregoing design, a deduplication rate can be ensured, and storage space occupied by data can be further reduced.

Figure 7:
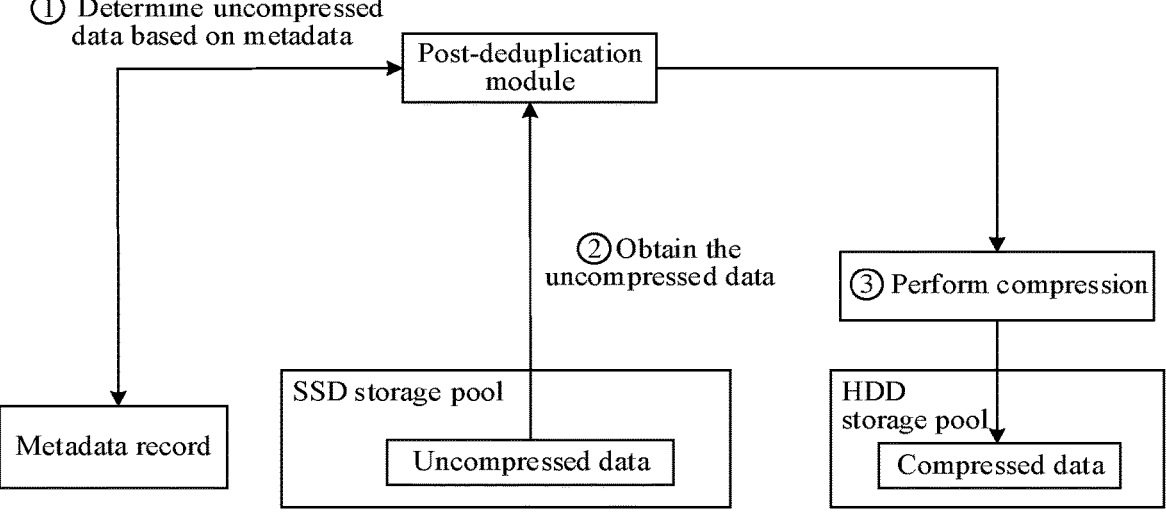
FIG. 7 is a schematic flowchart of a background compression manner according to an embodiment of this disclosure.

Similarly, in this disclosure, background compression may further be performed on uncompressed data stored in the SSD. Refer to FIG. 7. The background compression process may include the following steps. (1) The processor may determine the uncompressed data based on the metadata record. (2) The uncompressed data is obtained from the SSD. (3) Processing such as compression is performed on the data, and data obtained through processing is stored in the HDD. In the foregoing design, data backup efficiency may be improved through tiered storage, and a data deduplication rate and a reduction rate are ensured, to further reduce storage space occupied by data.

The following should be noted: (1) It should be noted that the foregoing determining the deduplication manner based on the deduplication rate is merely an example, and the data feature of the first data may alternatively be another parameter, for example, a priority of data or a priority of a backup task, or the deduplication manner may be determined by using another parameter. This is not limited in this embodiment of this disclosure. (2) The foregoing manner of storing the backup data in the tiered manner is merely an example. In the foregoing data processing process, tiered storage may not be performed. For example, if the hard disk of the storage device 20 includes only a memory of one performance, for example, includes only the SSD or the HDD, all of the un-deduplicated data, the deduplicated data, the uncompressed data, and the compressed data in the backup process may be stored in the memory with the same performance. This is not limited in this embodiment of this disclosure. (3) Step 407 to step 412 are optional steps, and are not mandatory steps. For example, in a backup scenario of this disclosure, only deduplication may be performed on the backup data, but compression is not performed. This is not limited in this embodiment of this disclosure. Therefore, these steps are shown in dashed boxes in FIG. 4.

In the foregoing manner, deduplication can be performed on data when computing resource utilization is low but the data deduplication rate is high. When the computing resource utilization is low and the data deduplication rate is low, deduplication is not performed on the data, to reduce computing resource overheads. In this way, when a normal production service is not affected, time when the computing resource utilization is low is used for data backup, so that a backup bandwidth is increased, the data deduplication rate is ensured, the storage space occupied by the data is reduced, and storage costs are reduced.

The following describes in detail the data processing method in embodiments of this disclosure with reference to specific embodiments.

Embodiment 1: Data Processing is Performed on a Client 10 Side

Backup software is used as an example. Backup software on the client 10 obtains data to be backed up (still referred to as first data) from a local storage device (such as a memory or a hard disk), and determines a deduplication manner based on a usage status of a computing resource of the client 10. CPU utilization is used as an example.

(1) If the CPU utilization of the client 10 is greater than a first preset value, the first data is sent to a storage device 20. Optionally, the client 10 may notify the storage device 20 that the first data is not compressed.

Subsequently, the storage device 20 performs processing such as deduplication and/or compression on the first data.

(2) If the CPU utilization does not exceed the first preset value, and a deduplication rate of the first data does not exceed a second preset value, deduplication is performed on a part of the first data, and other data is sent to the storage device.

(3) If the CPU utilization does not exceed the first preset value, and the deduplication rate of the first data exceeds the second preset value, deduplication is performed on the first data, and deduplicated data is recorded as second data.

A data deduplication process performed by the client 10 may include the following steps. The first data is used as an example, the client 10 divides the first data into a plurality of data blocks based on a hash algorithm, for example, the plurality of data blocks is a block 1, a block 2, a block 3, and a block 4. Then, a fingerprint (namely, a hash value) of each data block is calculated, and then the fingerprint of each data block is sent to the storage device 20.

The storage device 20 traverses a local fingerprint library, where the fingerprint library includes a fingerprint of any data block stored in the storage device 20. The fingerprint library is queried to determine whether a fingerprint (fp1) of the block 1, a fingerprint (fp2) of the block 2, a fingerprint (fp3) of the block 3, and a fingerprint (fp4) of the block 4 of the first data exist. If the fingerprints exist, the data block is a duplicate data block. For example, if fp1 and fp3 exist in the fingerprint library, and fp2 and fp4 do not exist in the fingerprint library, block 1 and block 3 are duplicate data blocks, and block 2 and block 4 are non-duplicate data blocks. Then, the storage device 20 sends a query result to the client 10. The query result herein indicates whether a duplicate data block exists in the first data, identification information of the duplicate data block, and the like.

The client 10 determines the duplicate data block in the first data based on the query result. For the duplicate data block, only metadata of the data block may be sent. For example, the metadata includes but is not limited to a fingerprint of the data block, an offset of the data block in the first data, a length of the data block, and the like. The metadata is not limited in this embodiment of this disclosure. Then, the client 10 sends the metadata of the duplicate data block and data of a non-duplicate data block to the storage device 20. In other words, the second data includes the metadata of the duplicate data block and the data of the non-duplicate data block. For example, in the foregoing example, the second data includes fp1, fp3, data of the data block 2, and data of the data block 4. Alternatively, the data and the metadata may be separated. For example, the second data includes only the data of the data block 2 and the data of the data block 4, and the second data, metadata of the data block 1, and metadata of the data block 3 are sent to the storage device 20. In the foregoing manner, after data deduplication is performed, a data amount of the second data is less than a data amount of the first data, so that a data transmission amount can be reduced, resource overheads and network burdens for backup can be reduced, and a logical backup bandwidth can be increased.

After the second data is obtained, a compression manner is determined based on a compression rate of the second data and the usage status of the computing resource of the client 10. The CPU utilization is still used as an example.

(1) If the compression rate of the second data is lower than a third preset value, the second data is sent to the storage device 20, and the storage device is notified that the second data is not compressed. Subsequently, the storage device 20 performs compression on the second data, to reduce storage resources for backing up the second data.

(2) If the compression rate of the second data is greater than or equal to the third preset value, and the CPU utilization is lower than a fourth preset value, compression is performed on the second data, and compressed data (for example, namely, third data) is sent to the storage device 20. Optionally, the client 10 may notify the storage device 20 of compression information of the third data, such as a compression algorithm and a checksum. If the storage device 20 determines that the third data is the compressed data, the storage device 20 may not perform compression on the third data.

(3) If the compression rate of the second data is greater than or equal to the third preset value, and the CPU utilization is greater than a fourth preset value, compression is performed on a part of the second data, compressed data and remaining uncompressed data of the second data are sent to the storage device 20, and the storage device 20 is notified of data that is not compressed. Subsequently, the storage device 20 may perform compression on the data again.

Embodiment 2: Data Processing is Performed on a Storage Device 20 Side

A client 10 sends data to be backed up (for example, first data) to a storage device 20. Correspondingly, the storage device 20 receives the first data sent by the client 10. It should be noted that the first data is un-deduplicated data and uncompressed data.

The storage device 20 determines a deduplication manner based on a usage status of a computing resource of the storage device 20. CPU utilization is used as an example.

1. If the CPU utilization of the storage device 20 is greater than a first preset value, deduplication is not performed. Optionally, the first data is stored in an SSD, and metadata of the first data is generated to record that the first data is not deduplicated.

In an implementation, when detecting that a preset condition (for example, referred to as a first preset condition) is met, the storage device 20 obtains, based on a metadata record, the un-deduplicated data, for example, the first data, from the SSD, to perform deduplication and compression on the first data, and store deduplicated and compressed data in an HDD.

The first preset condition includes but is not limited to the following conditions: (1) The CPU utilization of the storage device 20 is lower than a preset value (for example, a fifth preset value). For example, the fifth preset value may be equal to or different from the first preset value. This is not limited in this embodiment of this disclosure. (2) Preset time is reached. (3) A data amount of data stored in the SSD reaches a preset value (for example, denoted as a sixth preset value).

2. If the CPU utilization of the storage device 20 does not exceed the first preset value, and a deduplication rate of the first data does not exceed the second preset value, deduplication is performed on a part of the first data, and other data is sent to the storage device. Optionally, the deduplicated data is stored in the HDD, the uncompressed data is stored in the SDD, and metadata of the data is generated to record that the data is not compressed.

3. If the CPU utilization of the storage device 20 does not exceed the first preset value, and the deduplication rate of the first data exceeds the second preset value, deduplication is performed on the first data, and the deduplicated data is recorded as second data. Optionally, the second data may be stored in the HDD.

For a process in which the storage device 20 performs deduplication on the first data, refer to the foregoing descriptions. A difference lies in that the deduplication process is completely performed in the storage device 20, and details are not described herein again.

The second data is obtained by performing deduplication on the first data, and then a compression manner is determined based on a compression rate of the second data and the usage status of the computing resource of the storage device 20. The CPU utilization is still used as an example.

(1) If the compression rate of the second data is lower than a third preset value, compression may not be performed on the second data. Optionally, the storage device 20 stores the second data in the HDD.

(2) If the compression rate of the second data is greater than or equal to the third preset value, and the CPU utilization is lower than a fourth preset value, compression is performed on the second data. Optionally, the storage device 20 stores compressed data in the HDD.

(3) If the compression rate of the second data is greater than or equal to the third preset value, and the CPU utilization is greater than the fourth preset value, compression is performed on a part of the second data. Optionally, compressed data is stored in the HDD, and remaining uncompressed data in the second data is stored in the SSD, and metadata of the uncompressed data is generated. For the metadata, refer to the foregoing descriptions, and details are not described herein again.

In an implementation, when detecting that a preset condition (for example, referred to as a second preset condition) is met, the storage device 20 obtains, based on a metadata record, the uncompressed data from the SSD, and performs compression on the uncompressed data. Optionally, the storage device 20 stores compressed data in the HDD.

The second preset condition includes but is not limited to the following conditions. (1) The CPU utilization of the storage device 20 is lower than a preset value (for example, a seventh preset value). For example, the seventh preset value may be equal to or different from the fourth preset value. This is not limited in this embodiment of this disclosure. (2) Preset time is reached. (3) A data amount of data stored in the SSD reaches the sixth preset value.

Figure 8:
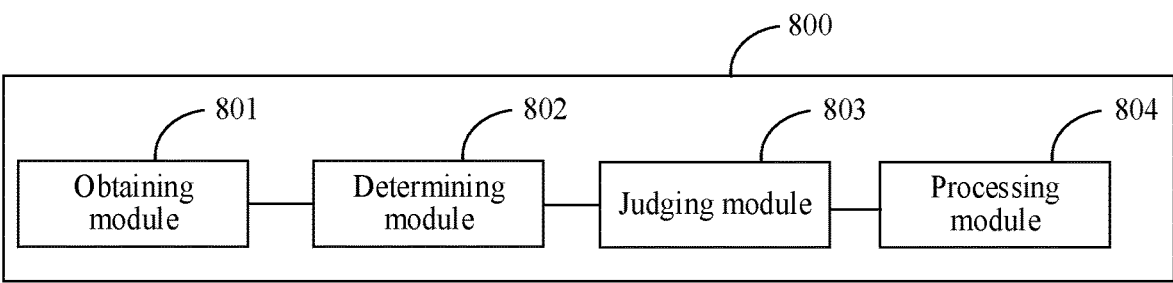
FIG. 8 is a schematic diagram of a structure of a data processing apparatus according to this disclosure.

Based on a same concept as the method embodiments, an embodiment of this disclosure further provides a data processing apparatus. FIG. 8 is a schematic diagram of a structure of a data processing apparatus 800 according to this disclosure. As shown in FIG. 8, the data processing apparatus 800 includes an obtaining module 801, a determining module 802, a judging module 803, and a processing module 804. The data processing apparatus 800 is configured to perform the method performed by the computing device in the foregoing method embodiments.

The obtaining module 801 is configured to obtain first data. For a specific implementation, refer to the descriptions of step 401 in FIG. 4, and details are not described herein again.

The determining module 802 is configured to determine a deduplication rate of the first data and a working status of the computing device. For a specific implementation, refer to the descriptions of step 401 and step 403 in FIG. 4, and details are not described herein again.

The judging module 803 is configured to judge whether the deduplication rate of the first data exceeds a first preset value when the working status of the computing device is a busy state. For a specific implementation, refer to related descriptions of step 402 and step 404 in FIG. 4, and details are not described herein again.

The processing module 804 is configured to, in response to the judgment, when the deduplication rate of the first data exceeds the first preset value, perform data deduplication on the first data to obtain second data. For a specific implementation, refer to the descriptions of step 406 in FIG. 4, and details are not described herein again. The processing module 804 is further configured to, when the deduplication rate of the first data does not exceed the first preset value, store the first data in a first memory of the computing device. For a specific implementation, refer to the descriptions of step 405 in FIG. 4, and details are not described herein again.

Optionally, the determining module 802 is further configured to determine a compression rate of the second data. For a specific implementation, refer to the descriptions of step 407 in FIG. 4, and details are not described herein again. The processing module 804 is configured to, when the compression rate of the second data is not lower than a second preset value and computing resource utilization is lower than a third preset value, perform compression on the second data, or when the compression rate of the second data is not lower than the second preset value and the computing resource utilization is not lower than the third preset value, perform compression on at least a part of the second data. For a specific implementation, refer to the descriptions of step 408 to step 411 in FIG. 4, and details are not described herein again.

Optionally, the processing module 804 is further configured to, when the compression rate of the second data is lower than the second preset value, store the second data in a second memory, where performance of the second memory is lower than that of the first memory, or when the compression rate of the second data is not lower than the second preset value, perform compression on the at least a part of the second data, and optionally, store compressed data in the second memory, and store uncompressed data of the second data in the first memory.

Optionally, the determining module 802 is further configured to determine the deduplication rate of the first data based on an attribute parameter of the first data, determine the deduplication rate of the first data based on a deduplication rate of target data corresponding to the first data, where the target data is data selected based on a preset condition, or determine the deduplication rate of the first data based on a similarity between the first data and data stored in the computer device.

Optionally, the processing module 804 is further configured to, when the computing device is in an idle state, perform deduplication and/or data compression on the first data, where the idle state is determined based on a usage status of the computing resource of the computing device.

Optionally, the computing resource includes a processor resource and/or a memory. For example, when processor utilization exceeds a fourth preset value, and/or memory utilization exceeds a fifth preset value, the working status of the computing device is the busy state, or when the processor utilization does not exceed the fourth preset value, and/or the memory utilization does not exceed the fifth preset value, the working status of the computing device is the idle state.

In a possible implementation, this disclosure further provides a data processing apparatus. The data processing apparatus may be the engine 121 or the storage system 120 shown in FIG. 2, or the server 110 shown in FIG. 3, and is configured to implement the foregoing related method steps to implement the method performed by the computing device in the foregoing embodiments. Refer to related descriptions of any one of method embodiments in FIG. 4 to FIG. 7, and details are not described herein again.

In a possible implementation, an embodiment of this disclosure further provides a computer storage medium. The computer storage medium stores computer instructions. When the computer instructions are run on a computing device, the computing device is enabled to perform the foregoing related method steps to implement the method performed by the computing device in the foregoing embodiments. Refer to related descriptions of any one of method embodiments in FIG. 4 to FIG. 7, and details are not described herein again.

In a possible implementation, an embodiment of this disclosure further provides a computer program product. When the computer program product runs on a computer, the computer is enabled to perform the foregoing related steps to implement the method performed by the computing device in the foregoing embodiments. Refer to related descriptions of any one of method embodiments in FIG. 4 to FIG. 7, and details are not described herein again.

In a possible implementation, an embodiment of this disclosure further provides an apparatus. The apparatus may be further a chip, a component, or a module. The apparatus may include a processor and a memory that are connected, where the memory is configured to store computer-executable instructions. When the apparatus runs, the processor may execute the computer-executable instructions stored in the memory, and the chip is enabled to perform the method performed by the computing device in the foregoing method embodiments. Refer to related descriptions of any one of method embodiments in FIG. 4 to FIG. 7. For brevity, details are not described herein again.

The data processing apparatus, the computer storage medium, the computer program product, and the chip provided in embodiments of this disclosure are all configured to perform the method corresponding to the computing device provided above. Therefore, for beneficial effects that can be achieved by the data processing apparatus, the computer storage medium, the computer program product, and the chip, refer to beneficial effects in the corresponding method provided above. Details are not described herein again.

In another possible implementation, this disclosure further provides a distributed system that includes a first computing device and a second computing device. The first computing device is configured to send data to be backed up to the second computing device. The first computing device includes a data processing apparatus, and is configured to perform any method in FIG. 4 to FIG. 7. For brevity, details are not described herein again.

Based on the descriptions of the foregoing implementations, a person skilled in the art may understand that, for the purpose of convenient and brief descriptions, division into the foregoing functional modules is merely used as an example for description. In an actual application, the foregoing functions may be allocated to different functional modules based on a requirement for implementation. That is, an inner structure of the apparatus is divided into different functional modules to implement all or some of the functions described above.

All or some of the foregoing embodiments may be implemented through software, hardware, firmware, or any combination thereof. When software is used for implementation, all or some of the foregoing embodiments may be implemented in a form of a computer program product. The computer program product includes one or more computer instructions. When the computer program instructions are loaded and executed on a computer, all or some of the procedures or functions according to embodiments of this disclosure are generated. The computer may be a general-purpose computer, a dedicated computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium that can be accessed by a computer, or a data storage device that is integrated by one or more usable media, such as a server or a data center. The usable medium may be a magnetic medium (for example, a floppy disk, a hard disk, or a magnetic tape), an optical medium (for example, a DIGITAL VERSATILE DISC (DVD)), a semiconductor medium (for example, an SSD), or the like.

The foregoing descriptions are merely specific implementations of this disclosure, but are not intended to limit a protection scope of this disclosure. Various equivalent modifications or replacements that can be easily figured out by any person skilled in the art within the technical scope disclosed in this disclosure, shall fall within the protection scope of this disclosure. Therefore, the protection scope of this disclosure shall be subject to the protection scope of the claims.

What is claimed is:

1. A method implemented by a computing device, wherein the method comprises:

obtaining, through a communication interface, first data from another computing device;

assessing a current working status of the computing device based on computing resource utilization, wherein the computing resource utilization comprises processor utilization or memory utilization;

checking whether a first deduplication rate of the first data exceeds a first preset value when the current working status is a busy state;

performing data deduplication on the first data to obtain second data when the first deduplication rate exceeds the first preset value;

storing the first data in a first memory of the computing device when the first deduplication rate does not exceed the first preset value;

performing compression on at least a portion of the second data when a first preset condition comprises the computing device is in an idle state, a compression rate of the second data is not lower than a second preset value, and when the processor utilization or the memory utilization is not lower than a third preset value; and controlling, by a controller of the computing device, storage of the second data by storing compressed portions of the second data in a second memory of the computing device and storing uncompressed portions of the second data in the first memory, wherein the second memory has a lower performance than the first memory, wherein the first memory and the second memory each comprise a different type of non-volatile memory, and wherein the non-volatile memory comprises a hard disk drive (HDD), a storage-class memory (SCM), or a solid-state drive (SSD).

2. The method of claim 1, wherein the first deduplication rate is based on an attribute parameter of the first data.

3. The method of claim 1, further comprising:

identifying that the computing device is in the idle state; and performing, in response to identifying that the computing device is in the idle state, data deduplication and data compression on the first data.

4. The method of claim 1, wherein the computing device is in the busy state when the processor utilization exceeds a fourth preset value or the memory utilization exceeds a fifth preset value.

5. The method of claim 1, wherein the computing device is in the idle state when the processor utilization does not exceed a fourth preset value or the memory utilization does not exceed a fifth preset value.

6. The method of claim 1, wherein the first deduplication rate is based on a second deduplication rate of target data corresponding to the first data, and wherein the target data is based on a preset condition.

7. The method of claim 1, wherein the first deduplication rate is based on a similarity between the first data and third data stored in the computing device.

8. The method of claim 1, further comprising:

identifying that the computing device is in the idle state; and performing, in response to identifying that the computing device is in the idle state, data deduplication on the first data.

9. The method of claim 1, further comprising:

identifying that the computing device is in the idle state; and performing, in response to identifying that the computing device is in the idle state, data compression on the first data.

10. A computing device comprising:

a first memory configured to store instructions;

a second memory configured to store instructions and having a lower performance than the first memory;

at least one processor coupled to the first memory and the second memory, and configured to execute the instructions to cause the computing device to:

obtain, through a communication interface, first data from another computing device;

assess a current working status of the computing device based on computing resource utilization, wherein the computing resource utilization comprises processor utilization or memory utilization;

check whether a first deduplication rate of the first data exceeds a first preset value when the current working status is a busy state;

perform data deduplication on the first data to obtain second data when the first deduplication rate exceeds the first preset value;

store the first data in the first memory of the computing device when the first deduplication rate does not exceed the first preset value; and perform compression on at least a portion of the second data when a first preset condition comprises the computing device is in an idle state, a compression rate of the second data is not lower than a second preset value, and when the processor utilization or the memory utilization is not lower than a third preset value; and a controller configured to control storage of the second data by storing compressed portions of the second data in the second memory and storing uncompressed portions of the second data in the first memory, wherein the first memory and the second memory each comprise a different type of non-volatile memory, and wherein the non-volatile memory comprises a hard disk drive (HDD), a storage-class memory (SCM), or a solid-state drive (SSD).

11. The computing device of claim 10, wherein the at least one processor is further configured to execute the instructions to cause the computing device to perform compression on the uncompressed portions of the second data when the first preset condition is met, and wherein the first preset condition comprises a preset time is reached.

12. The computing device of claim 11, wherein the at least one processor is further configured to execute the instructions to cause the computing device to store the second data in the second memory when the compression rate is lower than the second preset value.

13. The computing device of claim 10, wherein the first deduplication rate is based on at least one of:

an attribute parameter of the first data;

a second deduplication rate of target data corresponding to the first data, wherein the target data is based on a preset condition; or a similarity between the first data and third data stored in the computing device.

14. The computing device of claim 10, wherein the at least one processor is further configured to execute the instructions to cause the computing device to:

identify that the computing device is in the idle state; and perform, in response to identifying that the computing device is in the idle state, data deduplication or data compression on the first data.

15. The computing device of claim 10, wherein the computing device is in the busy state when the processor utilization exceeds a fourth preset value or the memory utilization exceeds a fifth preset value.

16. The computing device of claim 15, wherein the computing device is in the idle state when the processor utilization does not exceed the fourth preset value or the memory utilization does not exceed the fifth preset value.

17. A computer program product comprising computer-readable instructions that are stored on a non-transitory computer-readable medium and that, when executed by at least one processor, cause a computing device to:

obtain, through a communication interface, first data from another computing device;

assess a current working status of the computing device based on computing resource utilization, wherein the computing resource utilization comprises processor utilization or memory utilization;

check whether a first deduplication rate of the first data exceeds a first preset value when the current working status is a busy state;

perform data deduplication on the first data to obtain second data when the first deduplication rate of the first data exceeds the first preset value;

store the first data in a first memory of the computing device when the first deduplication rate does not exceed the first preset value;

perform compression at least a portion of on the second data when a first preset condition comprises the computing device is in an idle state, a compression rate of the second data is not lower than a second preset value, and when the processor utilization or the memory utilization is not lower than a third preset value; and control, by a controller of the computing device, storage of the second data by storing compressed portions of the second data in a second memory of the computing device and storing uncompressed portions of the second data in the first memory, wherein the second memory has a lower performance than the first memory, wherein the first memory and the second memory each comprise a different type of non-volatile memory, and wherein the non-volatile memory comprises a hard disk drive (HDD), a storage-class memory (SCM), or a solid-state drive (SSD).

18. The computer program product of claim 17, wherein the instructions, when executed by the at least one processor, further cause the computing device to perform compression on the uncompressed portions of the second data when the first preset condition is met, and wherein the first preset condition comprises a data amount of the first memory reaching a fourth preset value.

* * * * *